(12) United States Patent
Kurosaki et al.

(10) Patent No.: US 7,139,773 B2
(45) Date of Patent: Nov. 21, 2006

(54) OBJECT MATCHING MANAGEMENT SYSTEM ENABLING INSTANTANEOUS REFLECTION OF CHANGE IN OBJECT INFORMATION IN OPERATION TERMINALS

(75) Inventors: Masami Kurosaki, Kanagawa (JP); Hirotaka Kuroda, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 449 days.

(21) Appl. No.: 10/320,705

(22) Filed: Dec. 17, 2002

(65) Prior Publication Data
US 2003/0128238 A1 Jul. 10, 2003

(30) Foreign Application Priority Data
Dec. 28, 2001 (JP) .............................. 2001-400747

(51) Int. Cl.
G06F 17/00 (2006.01)
G06F 17/30 (2006.01)

(52) U.S. Cl. .................. 707/103 R; 707/6; 707/10; 707/102; 707/104.1; 707/200; 715/526; 345/419

(58) Field of Classification Search ............... 707/10, 707/102, 104.1, 103 R, 200, 6; 716/2, 7, 716/18; 715/526, 751; 345/419; 700/2
See application file for complete search history.

(56) References Cited

U.S. PATENT DOCUMENTS

| | | | |
|---|---|---|---|
| 5,418,728 A | * | 5/1995 | Yada ......................... 700/97 |
| 5,959,859 A | | 9/1999 | Maruyama ...................... 700/2 |
| 6,086,625 A | * | 7/2000 | Shouen ......................... 716/1 |
| 6,226,780 B1 | * | 5/2001 | Bahra et al. .................. 716/18 |
| 6,516,452 B1 | * | 2/2003 | Meding ......................... 716/5 |
| 6,563,498 B1 | * | 5/2003 | Hirata et al. ................. 345/419 |
| 6,578,174 B1 | * | 6/2003 | Zizzo ........................... 716/1 |
| 6,618,834 B1 | * | 9/2003 | Takeyama et al. ............. 716/2 |
| 2004/0098391 A1 | * | 5/2004 | Robertson et al. ............ 707/10 |

FOREIGN PATENT DOCUMENTS

| | | |
|---|---|---|
| CN | 1168512 A | 12/1997 |
| JP | 2000-194741 | 7/2000 |

* cited by examiner

Primary Examiner—Shahid Alam
Assistant Examiner—Susan Rayyan
(74) Attorney, Agent, or Firm—Morrison & Foerster LLP

(57) ABSTRACT

An object matching management apparatus includes an information storage part storing objects composing operation results, a communication part communicating with operation terminals for specified objectives, and an information processing part controlling operations of the information storage part and the communication part. The information processing part acquires information on processing performed on a specific one of the objects from an operation terminal through the communication part, updates the specific object stored in the information storage part based on the acquired processing information, and transmits the acquired processing information to another operation terminal through the communication part.

16 Claims, 7 Drawing Sheets

OBJECT #1

| COMPONENT ADDRESS | COMPONENT NAME | PAGE | COMPONENT FORM | MANUFACTURER'S NAME | CURRENT UNIT PRICE | STATUS | NUMBER | CURRENT PRICE |
|---|---|---|---|---|---|---|---|---|
| CN1 | COMMON | 1 | | XXXX | 0.00 | | 1 | 0.00 |
| CN2 | OUTPUT | 1 | | | 0.00 | | 1 | 0.00 |
| CN3 | GND | 1 | | | 0.00 | | 1 | 0.00 |
| CN4 | SWITCHED ON WHEN ≧ 1.2V | 1 | CHP | | 0.00 | | 1 | 0.00 |
| Q1 | TRANSISTOR : 2SC4807 | 1 | CHP | XXXX | 19.00 | AUTHORIZED | 1 | 19.00 |
| Q2 | TRANSISTOR : 2SC4807 | 1 | CHP | XXXX | 19.00 | AUTHORIZED | 1 | 19.00 |
| R1 | CHIP RESISTOR : 230Ω : ±5% : 1/10W : 1608 | 1 | CHPB | | 0.10 | | 1 | 0.10 |
| R2 | CHIP RESISTOR : 8.2kΩ : ±5% : 1/10W : 1608 | 1 | CHPB | | 0.10 | RECOMMENDED | 1 | 0.10 |
| R3 | CHIP RESISTOR : 1.1kΩ : ±5% : 1/10W : 1608 | 1 | CHPB | | 0.10 | | 1 | 0.10 |
| D1 | DIODE : 1SS355 | 1 | CHP | XXXX | 0.10 | RECOMMENDED | 1 | 0.10 |
| ... | ... | .. | ... | ... | ... | | .. | |
| ... | ... | .. | ... | ... | | | | |
| ... | | | | | | | | |

FIG.2

| OBJECT INFORMATION | COMPONENT NO. | COMPONENT NAME | COMPONENT ADDRESS | CIRCUIT DIAGRAM SYMBOL | TYPE | ... |
|---|---|---|---|---|---|---|
| OBJECT #1 INFORMATION | xxxxx | TRANSISTOR: 2SC4807 | Q1 | TRAN. SYM | GENERAL COMPONENT | ... |
| OBJECT #2 INFORMATION | ... | ... | ... | POWER. SYM | GRAPHIC SYMBOL | ... |
| OBJECT #3 INFORMATION | ... | ... | ... | ... | ... | ... |
| ... | ... | ... | ... | | | |
| ... | | | | | | |

FIG.5

| COMPONENT ADDRESS | COMPONENT NAME | PAGE | COMPONENT FORM | MANUFACTURER'S NAME | CURRENT UNIT PRICE | STATUS | NUMBER | CURRENT PRICE |
|---|---|---|---|---|---|---|---|---|
| CN1 | COMMON | 1 | | XXXX | 0.00 | | 1 | 0.00 |
| CN2 | OUTPUT | 1 | | | 0.00 | | 1 | 0.00 |
| CN3 | GND | 1 | | | 0.00 | | 1 | 0.00 |
| CN4 | SWITCHED ON WHEN ≧ 1.2V | 1 | CHP | | 0.00 | | 1 | 0.00 |
| Q1 | TRANSISTOR : 2SC4807 | 1 | CHP | XXXX | 19.00 | AUTHORIZED | 1 | 19.00 |
| Q2 | TRANSISTOR : 2SC4807 | 1 | CHP | XXXX | 19.00 | AUTHORIZED | 1 | 19.00 |
| R1 | CHIP RESISTOR : 230Ω : ±5% : 1/10W : 1608 | 1 | CHPB | | 0.10 | | 1 | 0.10 |
| R2 | CHIP RESISTOR : 8.2kΩ : ±5% : 1/10W : 1608 | 1 | CHPB | | 0.10 | RECOMMENDED | 1 | 0.10 |
| R3 | CHIP RESISTOR : 1.1kΩ : ±5% : 1/10W : 1608 | 1 | CHPB | | 0.10 | | 1 | 0.10 |
| D1 | DIODE : 1SS355 | 1 | CHP | XXXX | 0.10 | RECOMMENDED | 1 | 0.10 |
| ... | ... | ... | ... | ... | ... | | ... | |
| ... | ... | ... | ... | ... | ... | | | |

OBJECT #1

OBJECT MATCHING MANAGEMENT SYSTEM ENABLING INSTANTANEOUS REFLECTION OF CHANGE IN OBJECT INFORMATION IN OPERATION TERMINALS

BACKGROUND OF THE INVENTION

1. Field of the Invention

The present invention relates to an object matching management system for producing results while establishing synchronization of object information between a plurality of terminals.

2. Description of the Related Art

In designing and producing a product, generally, a designer creates the design information of the product, such as design drawings and component lists. A variety of information necessary for the production of the product is further created from the design information. Based on such information, selection of individual product components, designing of mounting, and verification of product profitability are performed. Thereby, information required for implementing the product is made clear, so that the production is performed according to the production plan.

A description will be given of the production of, for instance, an electronic component such as a printed circuit board (PCB) or a power supply unit (PSU). In a design section, generally, a circuit diagram is created by using CAD software, and at the same time, a list of components for the circuit is created.

Based on the circuit diagram and the component list, proposals on the assembly plant of the electronic component, the estimated price of the product, and a variety of information required for the production of the electronic component are discussed and determined. The discussion and the determination of the information are performed by a plurality of organizations having their respective special functions.

The above-described proposing of the assembly plant and discussion of the estimated price, that is, so-called downstream operations, are performed referring to the circuit diagram and the component list created in the upstream section. Therefore, if there is mismatching of components between the circuit diagram and the component, the downstream section cannot determine which of the circuit diagram and the component list correctly describes the components, thus affecting the estimation and discussion operations. Accordingly, if there is a change in the component list created in the design section, the change should be reflected in the circuit diagram.

Japanese Laid-Open Patent Application No. 2000-194741 discloses a configuration that prevents operations from being affected by mismatching between the diagram and the list by collating the circuit diagram, the substrate diagram, and the component list created in the design section with one another, determining a mismatch, and showing an operator the mismatch.

However, no such system exists in the prior art represented by the above-described technology that instantaneously reflects a change in the component list created by the design section in the circuit diagram and vice versa without going through a correction input operation by the operator.

When a correction input operation by the operator is required in reflecting a change, the operator should verify, each time, which component to change, and in some cases, may forget to make the change. Thus, the correction input operation by the operator lacks accuracy and efficiency. Accordingly, such an apparatus and a system have been desired that, in showing the same object information on platforms having different roles, such as platforms for creating the circuit diagram and the component list, respectively, of the same product, instantaneously reflect a change in the object information shown on one of the platforms in the object information shown on the other of the platforms.

SUMMARY OF THE INVENTION

Accordingly, it is a general object of the present invention to provide an object matching management system in which the above-described disadvantage is eliminated.

A more specific object of the present invention is to provide an object matching management system that, in showing the same object information on different platforms, instantaneously reflects a change in the object information shown on one of the platforms in the object information shown on the other of the platforms.

The above objects of the present invention are achieved by an object matching management apparatus including an information storage part storing objects composing operation results, a communication part communicating with operation terminals for specified objectives, and an information processing part controlling operations of the information storage part and the communication part, wherein the information processing part acquires information on processing performed on a specific one of the objects from a first one of the operation terminals through the communication part, updates the specific object stored in the information storage part based on the acquired processing information, and transmits the acquired processing information to a second one of the operation terminals through the communication part.

The above objects of the present invention are also achieved by an operation terminal for a specified objective, the operation terminal including: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of the information storage part, the information display part, the information input part, and the communication part, wherein the information processing part reads out the objects from the information storage part, displays the read-out objects on the information display part in accordance with the interface based on the display control information, acquires the instruction to process the object through the information input part, specifies the object corresponding to the instruction in the storage part based on the correspondence specifying information, updates the specified object based on the instruction and transmits, through the communication part to the object matching management apparatus, information on the processing performed on the specified object in accordance with the instruction, and updates the specified object in the information storage part based on information on the updated object in the object matching management apparatus when receiving the information therefrom through the communication part.

The above objects of the present invention are also achieved by a program for object matching management by an object matching management apparatus including an information storage part storing objects composing operation results, a communication part communicating with operation terminals for specified objectives, and an information processing part controlling operations of the information storage part and the communication part, the program causing the information processing part to perform the operations of: (a) acquiring information on processing performed on a specific one of the objects from a first one of the operation terminals through the communication part; (b) updating the specific object stored in the information storage part based on the acquired processing information; and (c) transmitting the acquired processing information to a second one of the operation terminals through the communication part.

The above objects of the present invention are also achieved by a program for operation support by an operation terminal for a specified objective, the operation terminal including: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of the information storage part, the information display part, the information input part, and the communication part, the program causing the information processing part to perform the operations of: (a) reading out the objects from the information storage part; (b) displaying the read-out objects on the information display part in accordance with the interface based on the display control information; (c) acquiring the instruction to process the object through the information input part; (d) specifying the object corresponding to the instruction in the information storage part based on the correspondence specifying information; (e) updating the specified object based on the instruction and transmitting, through the communication part to the object matching management apparatus, information on the processing performed on the specified object in accordance with the instruction; and (f) updating the specified object in the information storage part based on information on the updated object in the object matching management apparatus when receiving the information therefrom through the communication part.

The above objects of the present invention are also achieved by a computer-readable recording medium storing a program for object matching management by an object matching management apparatus including an information storage part storing objects composing operation results, a communication part communicating with operation terminals for specified objectives, and an information processing part controlling operations of the information storage part and the communication part, the program causing the information processing part to perform the operations of: (a) acquiring information on processing performed on a specific one of the objects from a first one of the operation terminals through the communication part; (b) updating the specific object stored in the information storage part based on the acquired processing information; and (c) transmitting the acquired processing information to a second one of the operation terminals through the communication part.

The above objects of the present invention are also achieved by a computer-readable recording medium storing a program for operation support by an operation terminal for a specified objective, the operation terminal including: an information storage part storing objects composing operation results, display control information for displaying the objects in accordance with an interface, and correspondence specifying, among the objects, information for specifying an object to be processed through the interface by an instruction; an information display part; an information input part; a communication part communicating with an object matching management apparatus; and an information processing part controlling operations of the information storage part, the information display part, the information input part, and the communication part, the program causing the information processing part to perform the operations of: (a) reading out the objects from the information storage part; (b) displaying the read-out objects on the information display part in accordance with the interface based on the display control information; (c) acquiring the instruction to process the object through the information input part; (d) specifying the object corresponding to the instruction in the information storage part based on the correspondence specifying information; (e) updating the specified object based on the instruction and transmitting, through the communication part to the object matching management apparatus, information on the processing performed on the specified object in accordance with the instruction; and (f) updating the specified object in the information storage part based on information on the updated object in the object matching management apparatus when receiving the information therefrom through the communication part.

The above objects of the present invention are also achieved by a method for object matching management in an object matching management system having an apparatus for object matching management, the apparatus including an information storage part storing objects composing operation results, a communication part communicating with operation terminals for specified objectives, and an information processing part controlling operations of the information storage part and the communication part, the method including the steps of: (a) the information processing part acquiring information on processing performed on a specific one of the objects from a first one of the operation terminals through the communication part; (b) the information processing part updating the specific object stored in the information storage part based on the acquired processing information; and (c) the information processing part transmitting the acquired processing information to a second one of the operation terminals through the communication part.

The above objects of the present invention are further achieved by a method for operation support in an object matching management system having an operation terminal for a specified objective, the operation terminal including: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of the information storage part, the information display part, the information input part, and the communication part, the method including the steps of: (a) the information processing part reading out the objects from the information storage part; (b) the information processing part displaying the read-out objects on the information display part in accordance with the interface based on the display control information; (c) the information processing part acquiring the instruction to process the object through the information input part; (d) the information processing part specifying the object corresponding to the instruction in the information storage part based on the correspondence specifying information; (e) the information processing part updating the specified object based on the instruction and transmitting, through the communication part to the object matching management apparatus, information on the processing performed on the specified object in accordance with the instruction; and (f) the information processing part updating the specified object in the information storage part based on information on the updated object in the object matching management apparatus when receiving the information therefrom through the communication part.

Thus, according to the present invention, the operation results can be generated while maintaining synchronization among the operation terminals and the object matching management apparatus in simultaneous operation on the network without collating and matching objects.

Further, by managing all the objects in the object matching management apparatus, the results of object editing in the upstream section such as a design section can be displayed and edited instantaneously at the time of editing in the next process. Therefore, a change in the objects can be checked and the change information can be reflected in the operation terminals without relying on human operations.

BRIEF DESCRIPTION OF THE DRAWINGS

Other objects, features and advantages of the present invention will become more apparent from the following detailed description when read in conjunction with the accompanying drawings, in which:

FIG. 2 is a diagram showing a data structure of an object table according to the embodiment of the present invention;

FIG. 5 is a diagram showing an objective-based interface displayed by an operation terminal for component list editing and designing according to the embodiment of the present invention;

DETAILED DESCRIPTION OF THE PREFERRED EMBODIMENTS

A description will now be given, with reference to the accompanying drawings, of an embodiment of the present invention.

According to the embodiment, when the contents of the objects constituting any of results, all of which are managed by a server, are updated at the request of any client, the contents as updated are transmitted to the other clients so that the contents of the objects retained by each client match the contents of the objects all of which are managed by the server.

Before describing a specific system configuration, a description will be given of the relationship between a result and an object according to the embodiment of the present invention. According to this embodiment, the result refers to electronic data such as a drawing or a diagram required in the process of designing and manufacturing a product. The contents of the result can be partially updated at the request of any of clients having different editing tools. A group of data serving as a minimum unit in the update is referred to as an object.

In the process of designing and manufacturing an electronic component such as a PCB and a PSU, for instance, results such as a circuit diagram and a component list are required and converted into electronic data to be managed by a server. A group of data for showing each component (element) of the results, that is, the circuit diagram and the component list, is an object.

In the following description, the results are a circuit diagram and a component list that are created as part of the work in the process of designing and manufacturing an electronic component, and the object is the data of an element that is the minimum updatable unit of the contents of the circuit diagram and the component list.

Figure 1:
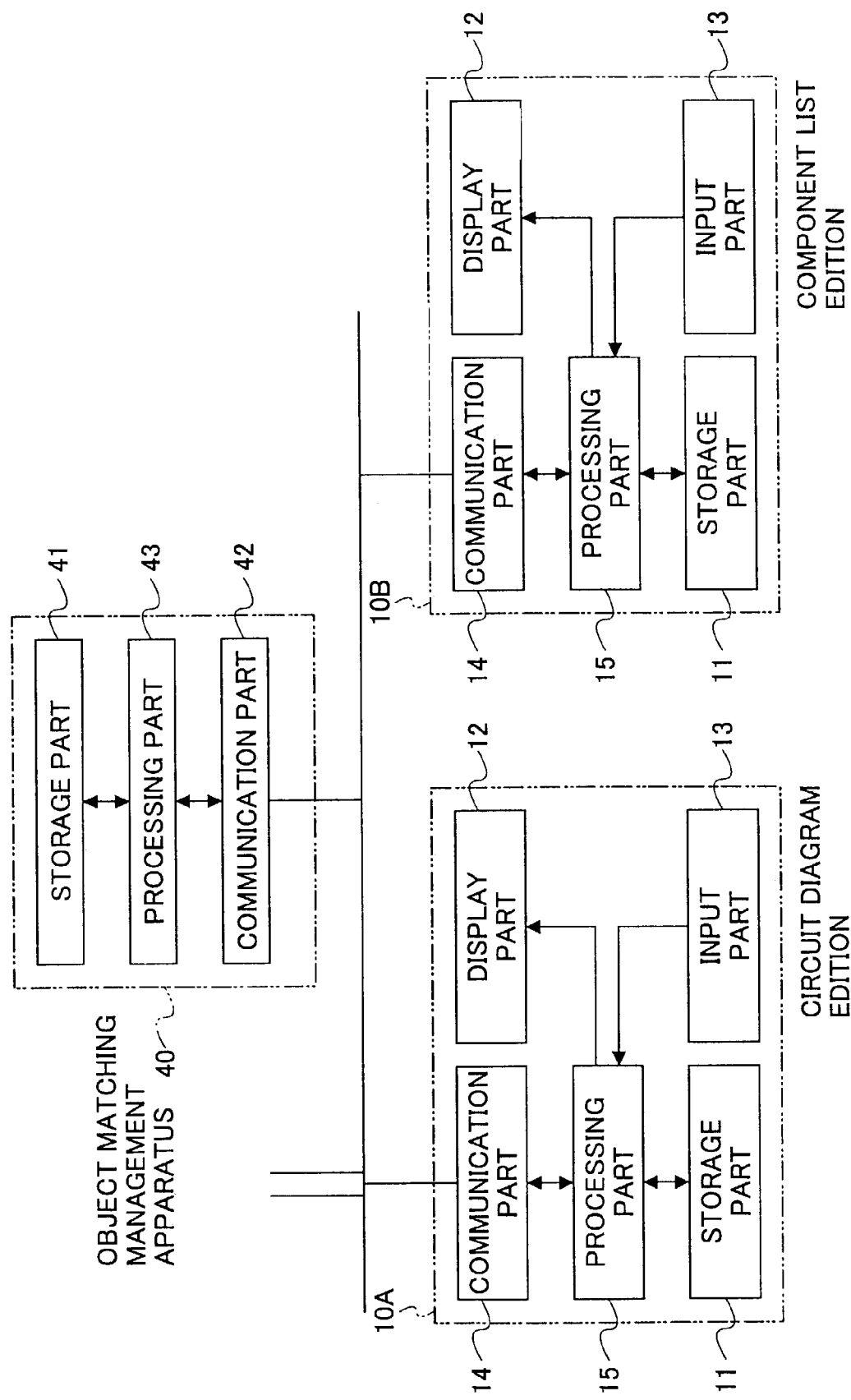
FIG. 1 is a block diagram showing the entire configuration of an embodiment of the present invention.

FIG. 1 is a block diagram showing a configuration of the embodiment of the present invention.

This embodiment includes an object matching management apparatus 40 as a server and objective-based operation terminals 10A and 10B for respective specified objectives as clients. The object matching management apparatus 40 and the operation terminals 10A and 10B are connected by a local area network (LAN). The operation terminal 10A functions as a tool for editing and designing a circuit diagram (hereinafter also referred to as a circuit diagram tool), and the operation terminal 10B functions as a tool for editing and designing a component list (hereinafter also referred to as a component list tool). The circuit diagram tool is used in the operation for editing and designing a circuit diagram and the component list tool is used in the operation for editing and designing a component list.

The object matching management apparatus 40 includes a storage part 41, a communication part 42, and a processing part 43.

The storage part 41 includes a memory, a register, and a hard disk, and is not necessarily required to have a physically unique configuration. The database of the storage part 41 stores an object table and an objective-based necessity determination table for objective-by-objective necessity determination (neither table shown in the drawing).

The object table stores each object that is a component (element) of the results created as part of the work (such results may be referred to as operation results).

FIG. 2 shows a data structure of the object table. As previously described, according to the present invention, the results refer to the data of the circuit diagram and the component list created as part of the work in the process of designing and manufacturing the electronic component, and the object refers to the data of an element that is a minimum updatable unit of the contents of the circuit diagram and the component list. The values of the fields of each record of the object table of FIG. 2 correspond to the element data.

The object table includes fields of component no., component name, component address, identification information for circuit diagram symbol, and type. For instance, the uppermost record of the object table of FIG. 2 is the data of OBJECT #1, which is stored as: component no. "XXXXX," component name "transistor: 2SC4807," component address "Q1," circuit diagram symbol identification information "TRAN. SYM," and type "general component." Each of the operation terminals 10A and 10B, capable of adding, changing, deleting, duplicating, and moving an object through an input part 13, displays each of the objects in accordance with its objective-based interface for its specified objective.

The necessity determination table stores the correspondence (correlation) between the object type and necessity determination information. The necessity determination information is used for determining the necessity of the object according to its type with respect to each of the objectives of the operation terminals 10A and 10B.

Figure 3:
FIG. 3 is a diagram showing a data structure of a necessity determination table according to the embodiment of the present invention.

FIG. 3 shows a data structure of the necessity determination table. The left column shows the object type. The object type corresponds to the field of "type" of the object table of FIG. 2. That is, the field of "type" of the object table serves as a foreign key for the necessity determination table. The center and right columns of the necessity determination table of FIG. 3 show the necessity determination information for the respective editing and designing tools. The necessity determination information includes two types of information: "NECESSARY" and "UNNECESSARY." If the object type is categorized as "NECESSARY," the objects corresponding to the object type are needed, and if the object type is categorized as "UNNECESSARY," the corresponding objects are not needed. In FIG. 3, the object type "general component" is set as "NECESSARY" for both circuit diagram and component list tools. The object type "graphic symbol" is set as "NECESSARY" for the circuit diagram tool while set as "UNNECESSARY" for the component list tool. Further, the object type "IC socket" is set as "UNNECESSARY" for both circuit diagram and component list tools.

The correspondence between the object type and the necessity determination information in the necessity determination table is updated at the request of any of the operation terminals 10A and 10B, which will be expatiated later in the description of an operation according to the embodiment.

The communication part 42 is a communication interface such as a network interface card.

The processing part 43 includes a central processing unit (CPU), a bus, and other necessary interfaces. The processing part 43 may include a plurality of CPUs performing distributed processing.

Each of the operation terminals 10A and 10B includes a storage part 11, a display part 12, the input part 13, a communication part 14, and a processing part 15. As previously described, the operation terminals 10A and 10B function as the circuit diagram tool and the component list tool, respectively, in this embodiment.

The storage part 11 includes a memory, a register, and a hard disk, and is not necessarily required to have a physically unique configuration. The database of the storage part 11 stores an object table (not shown in the drawing). Further, the storage part 11 stores objective-based display control information and correspondence specifying information.

The contents of the object table of each of the operation terminals 10A and 10B is designed to match the contents of the object table of the storage part 41 of the object matching management apparatus 40. That is, when the contents of the object table of the storage part 41 are updated at the request of one of the operation terminals 10A and 10B, the other of the operation terminals 10A and 10B, as required, obtains the detailed contents of the update from the object matching management apparatus 40 and updates the contents of the object table of its storage part 11 so that the contents of the object table of its storage part 11 match the updated contents of the storage part 41 of the object matching management apparatus 40. A specific operation for realizing such matching will be expatiated later in the description of the operation of the embodiment.

The objective-based display control information of the storage part 11 includes a variety of image control information required for generating the objective-based interface based on each object, such as layout information and symbol information.

The operation terminals 10A and 10B have their respective objective-based display control information according to their respective objectives. That is, the operation terminal 10A for circuit diagram editing and designing has the display control information for displaying its objective-based interface for circuit diagram editing and designing, and the operation terminal 10B for component list editing and designing has the display control information for displaying its objective-based interface for component list editing and designing. This will be described in detail with reference to FIGS. 4 and 5.

Figure 4:
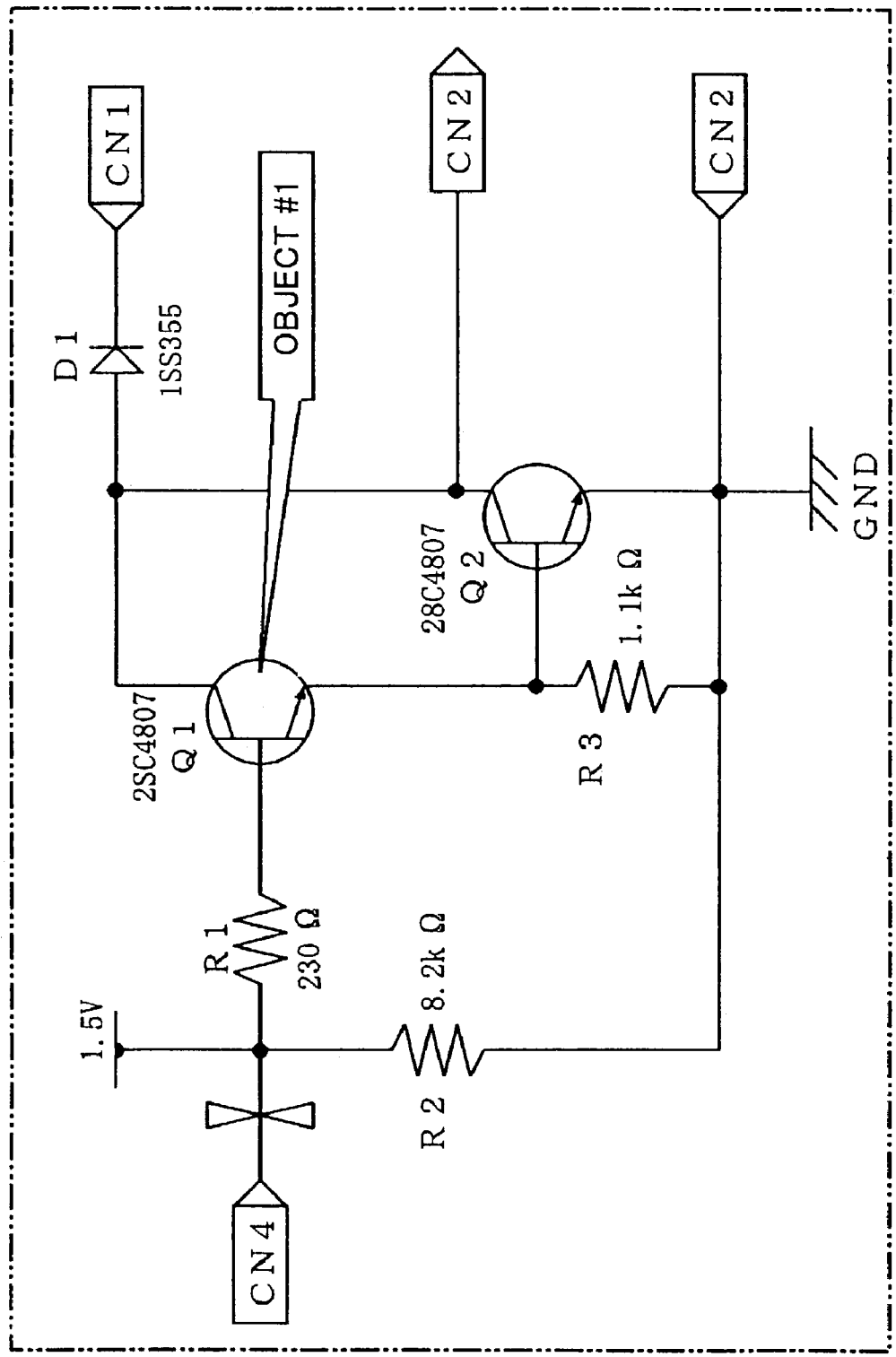
FIG. 4 is a diagram showing an objective-based interface displayed by an operation terminal for circuit diagram editing and designing according to the embodiment of the present invention.

FIG. 4 is a diagram showing the objective-based interface displayed by the operation terminal 10A for circuit diagram editing and designing. The interface has the symbols of the objects arranged as a circuit diagram. Further, the symbol of each object is arranged side-by-side with its component name and component address. The contents of the display control information required for such interface display include a table that correlates the identification information for each circuit symbol with its corresponding symbol and layout information for arranging the symbols at predetermined positions on the circuit diagram in accordance with the values of the corresponding component addresses.

For instance, in the upper center of FIG. 4, the symbol corresponding to OBJECT #1 of the object table of FIG. 2 is written side-by-side with its component name and component address. In order to realize such expression, the processing part 15 reads out from the record of OBJECT #1 in the object table its component name "transistor: 2SC4807," component address "Q1," and circuit diagram symbol identification information "TRAN. SYM" that are values required for generating its objective-based interface for circuit diagram editing and designing. Then, the processing part 15, based on these values and the contents of the objective-based display control information, writes the symbol corresponding to "TRANS. SYM" in the address corresponding to "Q1" in the circuit diagram, and shows the component address "Q1" and the component name "transistor: 2SC4807" side-by-side with the symbol.

FIG. 5 shows the objective-based interface displayed by the operation terminal 10B for component list editing and designing. The interface displays the data of the objects as a component list table. Since the component list is used for price estimation and ordering of components, the component list does not include information required for arranging the components in the circuit diagram, such as the circuit diagram symbol identification information, but includes information such as component form, manufacturer's name, current unit price, status, number, and current price. As is apparent from the above description, the objective-based interface for component list editing and designing does not display the contents of each record of the object table without any modification, but displays the component list that includes data required for estimating and ordering the components, such as component form, manufacturer's name, current unit price, status, number, and current price, in addition to the necessary data extracted from the object table. Accordingly, the contents of the objective-based display control information required for realizing such interface display include a table that correlates the component name of each component with the values of its corresponding component form, manufacturer's name, current unit price, status, number, and current price. Since information such as current unit price and current price is subject to change, it is desirable that the operator of the operation terminal 10B update the contents of such information to the latest data whenever necessary.

For instance, the fifth data row from the top of the table of FIG. 5 shows the component information corresponding to OBJECT #1 of the object table of FIG. 2. In order to realize such expression, the processing part 15 reads out from the record of OBJECT #1 in the object table its component address "Q1" and component name "transistor: 2SC4807" that are values required for generating the objective-based interface for component list editing and designing. At the same time, the processing part 15 specifies the following values from the predetermined contents of the objective-based display control information:

Number of page in the circuit diagram where OBJECT #1 is shown: 1,
Component form: CHP,
Manufacturer's name: XXXX,
Current unit price: 19.00,
Status: authorized,
Number: 1, and
Current Price: 19.00.

The processing part 15 displays the record of the fifth data row of the table of FIG. 5 based on the above-described data.

The correspondence specifying information stored in the storage part 11 is used for specifying the correlation (correspondence) between an object to be added to, changed in, deleted from, duplicated in, or moved in the objective-based interface by an instruction and the corresponding object stored in the object table. Assumed to be the correspondence specifying information is an application program specifying the object of the object table corresponding to an object arranged in a specified position on the objective-based interface when the instruction on the object of the interface is recognized.

The display part 12 is a computer display, for instance.

The input part 13 is a keyboard or a pointing device, for instance.

The communication part 14 is a communication interface such as a network interface card.

The processing part 15 includes a CPU, a bus, and other necessary interfaces. The processing part 15 may include a plurality of CPUs performing distributed processing.

Figure 6:
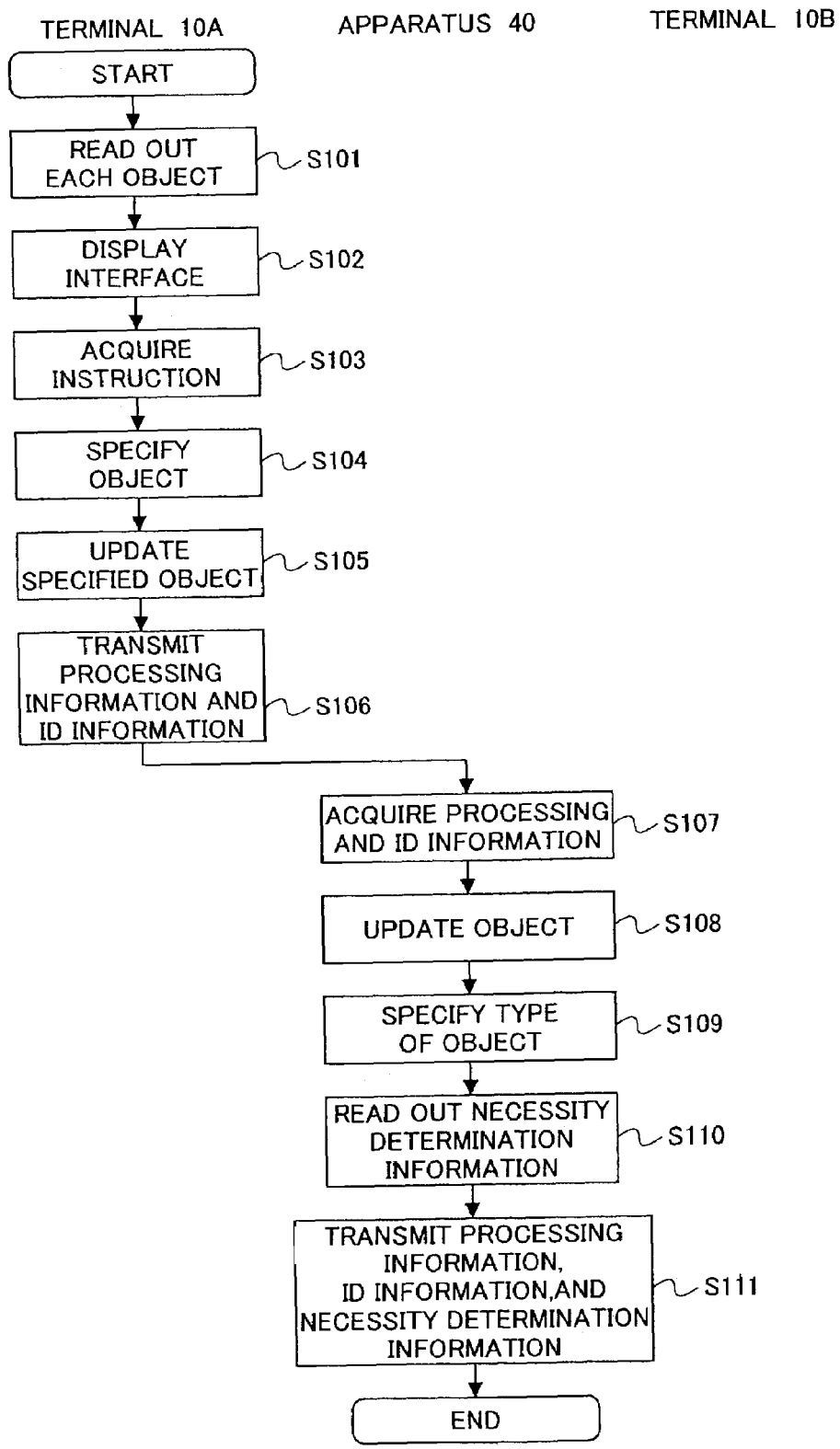
FIG. 6 is a flowchart of object update notification processing according to the embodiment of the present invention.

Next, a description will be given of an operation of this embodiment. The operation includes object update notification processing and detailed contents acquisition processing, which will be described separately. FIG. 6 is a flowchart of the object update notification processing and FIG. 7 is a flowchart of the detailed contents acquisition processing.

Figure 7:
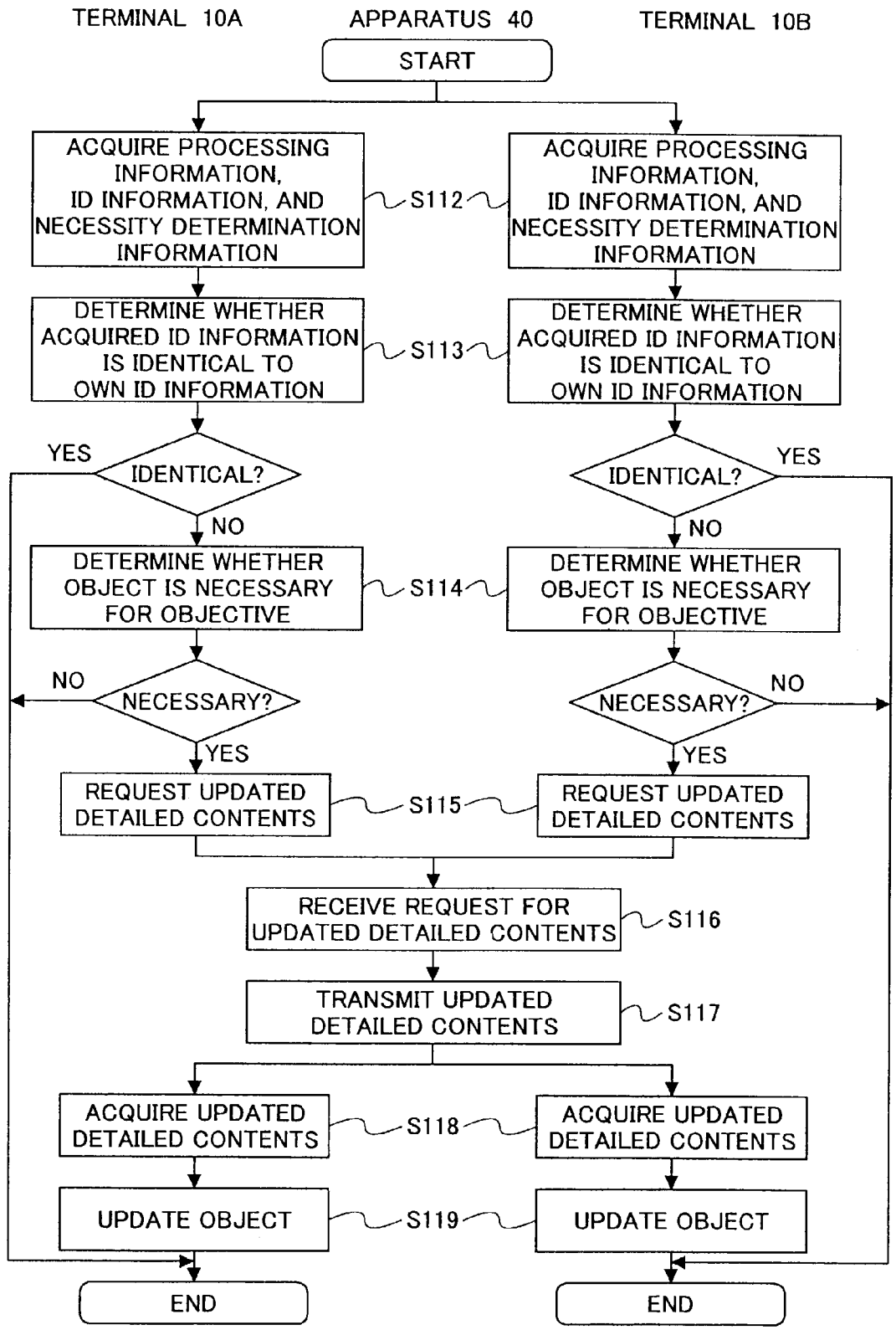
FIG. 7 is a flowchart of detailed contents acquisition processing according to the embodiment of the present invention.

In each of FIGS. 6 and 7, the operation of the processing part 15 of the operation terminal 10A, the operation of the processing part 43 of the object matching management apparatus 40, and the operation of the processing part 15 of the operation terminal 10B are shown on the left, in the center, and on the right, respectively.

Here, a description will be given of the case where an object managed in the object matching management apparatus 40 is updated at the request of the operation terminal 10A and the detailed contents of the update is reflected in the operation terminal 10B.

First, in step S101 of FIG. 6, the processing part 15 of the operation terminal 10A reads out each object from the object table of the storage part 11.

In step S102, the processing part 15 displays the read-out objects on the display part 12 in accordance with the objective-based interface based on the objective-based display control information of the storage part 11. As previously described, the objective-based interface of the operation terminal 10A has the screen layout as shown in FIG. 4. The operator of the operation terminal 10A proceeds with the operation, referring to the objects arranged on the objective-based interface. When there arises necessity to add, change, delete, duplicate, or move the contents of a specific object in the process of the operation, an instruction to add, change, delete, duplicate, or move the contents of the specific object is input from the input part 13.

In step S103, the processing part 15 acquires, via the input part 13, the instruction of addition, changing, deletion, duplication, or moving with respect to the objects displayed in accordance with the objective-based interface.

In step S104, the processing part 15 specifies the object stored in the storage part 11 which object corresponds to the object of the instruction based on the correspondence specifying information.

In step S105, the processing part 15 updates (processes) the specified object in the storage part 11 in accordance with the instruction.

In step S106, the processing part 15 transmits, through the communication part 14 to the object matching management apparatus 40, the object addition, deletion, change, duplication, or moving information (object processing information) corresponding to the instruction together with the identification (ID) information of the operation terminal 10A.

In step S107, the processing part 43 of the object matching management apparatus 40 acquires the object processing information and the ID information of the operation terminal 10A from the operation terminal 10A through the communication part 42, and temporarily stores the acquired information in the storage part 41.

In step S108, the processing part 43 updates the corresponding object stored in the storage part 41 based on the acquired object processing information. For instance, if the acquired object processing information states that "OBJECT #1 has been deleted," the processing part 43 specifies the record corresponding to OBJECT #1 among the records of the object table stored in the storage part 41 and updates the corresponding record based on the information that "OBJECT #1 has been deleted."

Next, in step S109, the processing part 43 specifies the type of the processed (updated) object based on the acquired object processing information. The type of the object is specified by the value of the field of "type" of the fields forming the records of the object table. In the object table of FIG. 2, for instance, the value of the "type" field in the record of OBJECT #1 is "general component."0 Therefore, when the processed object is OBJECT #1, its object type is specified as "general component."

In step S110, the processing part 43 reads out the necessity determination information corresponding to the specified object type from the necessity determination table stored in the storage part 41. For instance, when the processed object is OBJECT #1, the processing part 43 reads out the necessity determination information corresponding to "general component" with respect to each of the editing and designing tools. As shown in FIG. 3, the necessity determination information corresponding to "general component" is set as "NECESSARY" for each of the circuit diagram tool and the component list tool.

If no necessity determination information corresponding to the specified object type exists in the necessity determination table of the storage part 41, the necessity determination information corresponding to the specified object type is newly added to the table at the request of any of the operation terminals 10A and 10B. This addition is performed in the following process. First, the processing part 43 of the object matching management apparatus 40 receives a request from the operation terminal 10A or 10B to add the necessity determination information corresponding to the object type having no corresponding necessity determination information set in the necessity determination table. Then, the processing part 43 newly adds to the necessity determination table a correlation between the object type corresponding to the request and its corresponding necessity determination information.

In step S111, the processing part 43 transmits the object processing information, the acquired ID information, and the read-out necessity determination information to each of the operation terminals 10A and 10B through the communication part 42.

Thereby, the object update notification processing is terminated, and then, the detailed contents acquisition processing is started immediately.

In step S112 of FIG. 7, each of the operation terminals 10A and 10B acquires the object processing information, the ID information, and the necessity determination information from the object matching management apparatus 40 through the communication part 14.

In step S113, the processing part 15 of each of the operation terminals 10A and 10B determines whether the acquired ID information is identical to the ID information of its terminal transmitted to the object matching management apparatus 40 in step S106 of FIG. 6.

In each of the operation terminals 10A and 10B, if the processing part 15 determines in step S113 that the acquired ID information is identical to the transmitted ID information, the processing part 15 determines that no additional updating of the object table of the storage part 11 is necessary, and terminates the operation. Meanwhile, if the processing part 15 determines in step S113 that the acquired ID information is not identical to the transmitted ID information, in step S114, the processing part 15 determines, based on the acquired necessity determination information, whether the processed object is necessary to achieve the objective of its operation terminal (10A or 10B). As previously described, the operation terminal 10A transmits its own ID information to the object matching management apparatus 40 in step S106 in this case. Therefore, the processing part 15 of the operation terminal 10A terminates the operation, while the processing part 15 of the operation terminal 10B makes a determination based on the necessity determination information.

If the processing part 15 determines in step S114 that the processed object is not necessary, the processing part 15 terminates the operation. Meanwhile, if the processing part 15 determines in step S114 that the processed object is necessary, in step S115, the processing part 15 requests the detailed contents of the processed or updated object from the object matching management apparatus 40. The determination of step S114 as to whether the processed object is necessary or not is made by analyzing whether the necessity determination information acquired in step S112 is "NECESSARY" or "UNNECESSARY" for the editing and designing tool (or the operation terminal 10A or 10B) of the processing part 15. The "detailed contents" of the processed or updated object refer to the values of the fields of the record corresponding to the processed object in the object matching management apparatus 40.

In step S116, the processing part 43 of the object matching management apparatus 40 acquires, through the communication part 42, the request based on the object processing information for the detailed contents of the processed or updated object from the operation terminal determining that the processed object is necessary (in this case, from the operation terminal 10B).

In step S117, the processing part 43 transmits, through the communication part 42, the detailed contents of the object processed or updated in step S105 of FIG. 6 to the operation terminal that has made the request (to the operation terminal 10B in this case).

In step S118, the processing part of the operation terminal (10B) acquires, through the communication part 14, the detailed contents of the processed or updated object from the object matching management apparatus 40 that has responded to the request.

In step S119, the processing part 15 updates the corresponding object in the object table stored in the storage part 11 based on the acquired detailed contents.

Thereby, the operation is terminated.

According to the above-described embodiment, when an object is added, deleted, changed, duplicated, or moved in one of the operation terminals 10A and 10B, the contents of the processed object are instantaneously reflected in the other of the operation terminals 10A and 10B through the object matching management apparatus 40. Therefore, the results can be generated with the synchronization being maintained without object collation and matching operations.

Further, each of the operation terminals 10A and 10B acquires the object processing information from the object matching management apparatus 40 together with the ID information of the operation terminal that has processed (updated) the object. In each of the operation terminals 10A and 10B, when the acquired ID information is identical to its own ID information, no request to acquire the detailed contents of the processed object is made. Thereby, if the operation terminal 10A or 10B has updated an object and updated the record of the object in the object table of the storage part 11, the operation of acquiring the detailed contents of the processed object can be omitted, thus enabling efficient usage of the communication lines.

Further, each of the operation terminals 10A and 10B acquires the object processing information from the object matching management apparatus 40 together with the necessity determination information. In each of the operation terminals 10A and 10B, when it is determined that the processed object is unnecessary to achieve the objective of the operation terminal, no request to acquire the detailed contents of the processed object is made. Thereby, the operation of acquiring the detailed contents of the unnecessary object can be omitted, thus enabling efficient usage of the communication lines.

The present invention is not limited to the specifically disclosed embodiment, but variations and modifications may be made without departing from the scope of the present invention.

In the above-described embodiment, for instance, the objective-based interface of the component list editing and designing tool may additionally include other display items necessary for estimation and ordering of components than those previously described (component address, component name, circuit diagram page number, component form, manufacturer's name, current unit price, status, number, and current price).

Further, the types of operation terminals connected to the object matching management apparatus 40 are not limited to the two types described in the above-described embodiment, that is, the type of the operation terminal 10A functioning as the circuit diagram editing and designing tool and the type of the operation terminal 10B functioning as the component list editing and designing tool. Operation terminals specialized in other operation objectives, such as a printed wiring board (PWD) layout check tool and a mounting designing interface tool, may also be connected to the object matching management apparatus 40 in addition to the operation terminals 10A and 10B, so that the results are generated with synchronization being maintained among the multiple operation terminals including those additional operation terminals.

According to the above-described configuration and function of the present invention, the results can be generated while maintaining synchronization among the operation terminals and the object matching management apparatus in simultaneous operation on the network without collating and matching objects, which is an excellent effect that has not been achieved conventionally.

Further, by managing all objects in the object matching management apparatus, the results of object editing in the upstream section such as a design section can be displayed and edited instantaneously at the time of editing in the next process. Therefore, a change in the objects can be checked and the change (difference) information can be reflected in the operation terminals without relying on human operations.

The present application is based on Japanese Laid-Open Patent Application No. 2001-400747 filed on Dec. 28, 2001, the entire contents of which are hereby incorporated by reference.

What is claimed is:

1. An operation terminal for a specified objective, comprising: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of said information storage part, said information display part, said information input part, and said communication part, wherein said information processing part reads out the objects from said information storage part, displays the read-out objects on said information display part in accordance with the interface based on the display control information, acquires the instruction to process the object through said information input part, specifies the object corresponding to the instruction in said information storage part based on the correspondence specifying information, updates the specified object based on the instruction and transmits, through said communication part to the object matching management apparatus, information on the processing performed on the specified object in accordance with the instruction, and updates the specified object in said information storage part based on information on the updated object in the object matching management apparatus when receiving the information therefrom through said communication part, whereby a change in object information displayed on the operation terminal is immediately reflected in object information displayed on another operation terminal and whereby a change in object information displayed on another operation terminal is immediately reflected in object information displayed on the operation terminal.

2. The operation terminal as claimed in claim 1, wherein said information processing part transmits the processing information on the specified object through said communication part to the object matching management apparatus together with identification information of the operation terminal; and in updating the specified object in said information storage part, acquires the processing information and the identification information through said communication part from the object matching management apparatus, requests the information on the updated object from the object matching management apparatus when the acquired identification information is different from identification information of the operation terminal, acquires, through said communication part, the information on the updated object from the object matching management apparatus that has responded to the request, and updates the specified object in said information storage part based on the acquired information on the updated object.

3. The operation terminal as claimed in claim 1, wherein said information processing part, in updating the specified object in said information storage part, acquires, through said communication part from the object matching management apparatus, the processing information and necessity determination information for the updated object, determines, based on the necessity determination information, whether the updated object is necessary for the objective of the operation terminal, requests the information on the updated object from the object matching management apparatus when said information processing part determines that the updated object is necessary for the objective of the operation terminal, acquires the information on the updated object through said communication part from the object matching management apparatus that has responded to the request, and updates the specified object in said information storage part based on the acquired information on the updated object.

4. The operation terminal as claimed in claim 1, wherein the specified object is added to, changed in, deleted from, duplicated in, or moved in the operation terminal by the instruction to process the specified object.

5. A program for operation support by an operation terminal for a specified objective, the operation terminal including: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of the information storage part, the information display part, the information input part, and the communication part, the program causing the information processing part to perform the operations of: (a) reading out the objects from the information storage part; (b) displaying the read-out objects on the information display part in accordance with the interface based on the display control information; (c) acquiring the instruction to process the object through the information input part; (d) specifying the object corresponding to the instruction in the information storage part based on the correspondence specifying information; (e) updating the specified object based on the instruction and transmitting, through the communication part to the object matching management apparatus, information on the processing performed on the specified object in accordance with the instruction; and (f) updating the specified object in the information storage part based on information on the updated object in the object matching management apparatus when receiving the information therefrom through the communication part, whereby a change in object information displayed on the operation terminal is immediately reflected in object information displayed on another operation terminal and whereby a change in object information displayed on another operation terminal is immediately reflected in object information displayed on the operation terminal.

6. The program as claimed in claim 5, wherein the information processing part is caused, in said operation (e), to transmit identification information of the operation terminal through the communication part to the object matching management apparatus together with the processing information on the specified object; and in said operation (f), to perform the operations of: (g) acquiring the processing information and the identification information through the communication part from the object matching management apparatus; (h) requesting the information on the updated object from the object matching management apparatus when the acquired identification information is different from identification information of the operation terminal; (i) acquiring, through the communication part, the information on the updated object from the object matching management apparatus that has responded to the request; and (j) updating the specified object in the information storage part based on the acquired information on the updated object.

7. The program as claimed in claim 5, wherein the information processing part is caused, in said operation (f), to perform the operations of: (g) acquiring, through the communication part from the object matching management apparatus, the processing information and necessity determination information for the updated object; (h) determining, based on the necessity determination information, whether the updated object is necessary for the objective of the operation terminal; (i) requesting the information on the updated object from the object matching management apparatus when the information processing part determines that the updated object is necessary for the objective of the operation terminal; (j) acquiring the information on the updated object through the communication part from the object matching management apparatus that has responded to the request; and (k) updating the specified object in the information storage part based on the acquired information on the updated object.

8. The program as claimed in claim 5, wherein the specified object is added to, changed in, deleted from, duplicated in, or moved in the operation terminal by the instruction to process the specified object.

9. A computer-readable recording medium storing a program for operation support by an operation terminal for a specified objective, the operation terminal including: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of the information storage part, the information display part, the information input part, and the communication part, the program causing the information processing part to perform the operations of: (a) reading out the objects from the information storage part; (b) displaying the read-out objects on the information display part in accordance with the interface based on the display control information; (c) acquiring the instruction to process the object through the information input part; (d) specifying the object corresponding to the instruction in the information storage part based on the correspondence specifying information; (e) updating the specified object based on the instruction and transmitting, through the communication part to the object matching management apparatus, information on the processing performed on the specified object in accordance with the instruction; and (f) updating the specified object in the information storage part based on information on the updated object in the object matching management apparatus when receiving the information therefrom through the communication part, whereby a change in object information displayed on the operation terminal is immediately reflected in object information displayed on another operation terminal and whereby a change in object information displayed on another operation terminal is immediately reflected in object information displayed on the operation terminal.

10. The computer-readable recording medium as claimed in claim 9, wherein the information processing part is caused, in said operation (e), to transmit identification information of the operation terminal through the communication part to the object matching management apparatus together with the processing information on the specified object; and in said operation (f), to perform the operations of: (g) acquiring the processing information and the identification information through the communication part from the object matching management apparatus; (h) requesting the information on the updated object from the object matching management apparatus when the acquired identification information is different from identification information of the operation terminal; (i) acquiring, through the communication part, the information on the updated object from the object matching management apparatus that has responded to the request; and (j) updating the specified object in the information storage part based on the acquired information on the updated object.

11. The computer-readable recording medium as claimed in claim 9, wherein the information processing part is caused, in said operation (f), to perform the operations of: (g) acquiring, through the communication part from the object matching management apparatus, the processing information and necessity determination information for the updated object; (h) determining, based on the necessity determination information, whether the updated object is necessary for the objective of the operation terminal; (i) requesting the information on the updated object from the object matching management apparatus when the information processing part determines that the updated object is necessary for the objective of the operation terminal; (j) acquiring the information on the updated object through the communication part from the object matching management apparatus that has responded to the request; and (k) updating the specified object in the information storage part based on the acquired information on the updated object.

12. The computer-readable recording medium as claimed in claim 9, wherein the specified object is added to, changed in, deleted from, duplicated in, or moved in the operation terminal by the instruction to process the specified object.

13. In an object matching management system having an operation terminal for a specified objective, the operation terminal including: an information storage part storing objects composing operation results, display control information for displaying the objects in accordance with an interface, and correspondence specifying information for specifying, among the objects, an object to be processed through the interface by an instruction; an information display part; an information input part; a communication part communicating with an object matching management apparatus; and an information processing part controlling operations of the information storage part, the information display part, the information input part, and the communication part, a method for operation support, the method comprising the steps of: (a) the information processing part reading out the objects from the information storage part; (b) the information processing part displaying the read-out objects on the information display part in accordance with the interface based on the display control information; (c) the information processing part acquiring the instruction to process the object through the information input part; (d) the information processing part specifying the object corresponding to the instruction in the information storage part based on the correspondence specifying information; (e) the information processing part updating the specified object based on the instruction and transmitting, through the communication part to the object matching management apparatus, information on the processing performed on the specified object in accordance with the instruction; and (f) the information processing part updating the specified object in the information storage part based on information on the updated object in the object matching management apparatus when receiving the information therefrom through the communication part, whereby a change in object information displayed on the operation terminal is immediately reflected in object information displayed on another operation terminal and whereby a change in object information displayed on another operation terminal is immediately reflected in object information displayed on the operation terminal.

14. The method as claimed in claim 13, wherein: said step (e) transmits identification information of the operation terminal through the communication part to the object matching management apparatus together with the processing information on the specified object; and said step (f) comprises the steps of: (g) the information processing part acquiring the processing information and the identification information through the communication part from the object matching management apparatus; (h) the information processing part requesting the information on the updated object from the object matching management apparatus when the acquired identification information is different from identification information of the operation terminal; (i) the information processing part acquiring, through the communication part, the information on the updated object from the object matching management apparatus that has responded to the request; and (j) the information processing part updating the specified object in the information storage part based on the acquired information on the updated object.

15. The method as claimed in claim 13, wherein said step (f) comprises the steps of: (g) the information processing part, acquiring, through the communication part from the object matching management apparatus, the processing information and necessity determination information for the updated object; (h) the information processing part determining, based on the necessity determination information, whether the updated object is necessary for the objective of the operation terminal; (i) the information processing part requesting the information on the updated object from the object matching management apparatus when the information processing part determines that the updated object is necessary for the objective of the operation terminal; (j) the information processing part acquiring the information on the updated object through the communication part from the object matching management apparatus that has responded to the request; and (k) the information processing part updating the specified object in the information storage part based on the acquired information on the updated object.

16. The method as claimed in claim 13, wherein the specified object is added to, changed in, deleted from, duplicated in, or moved in the operation terminal by the instruction to process the specified object.

* * * * *